United States Patent
Snelgrove

(10) Patent No.: US 9,407,236 B2
(45) Date of Patent: *Aug. 2, 2016

(54) SYSTEM AND METHOD FOR PROCESSING A SIGNAL WITH A FILTER EMPLOYING FIR AND IIR ELEMENTS

(71) Applicant: KAPIK INC., Toronto (CA)

(72) Inventor: William Martin Snelgrove, Toronto (CA)

(73) Assignee: KAPIK INC., Toronto (CA)

( * ) Notice: Subject to any disclaimer, the term of this patent is extended or adjusted under 35 U.S.C. 154(b) by 220 days.

This patent is subject to a terminal disclaimer.

(21) Appl. No.: 14/182,391

(22) Filed: Feb. 18, 2014

(65) Prior Publication Data

US 2014/0164459 A1 Jun. 12, 2014

Related U.S. Application Data

(63) Continuation of application No. 13/001,042, filed as application No. PCT/CA2009/000865 on Jun. 23, 2009, now Pat. No. 8,655,936.

(60) Provisional application No. 61/074,732, filed on Jun. 23, 2008.

(51) Int. Cl.
  *G06F 17/10* (2006.01)
  *H03H 9/46* (2006.01)
  *H03H 17/02* (2006.01)

(52) U.S. Cl.
  CPC ............. *H03H 9/46* (2013.01); *H03H 17/0219* (2013.01); *H03H 17/0288* (2013.01)

(58) Field of Classification Search
  None
  See application file for complete search history.

(56) References Cited

U.S. PATENT DOCUMENTS

| | | | | | |
|---|---|---|---|---|---|
| 4,703,447 | A | * | 10/1987 | Lake, Jr. | H03H 17/06 708/319 |
| 6,177,897 | B1 | * | 1/2001 | Williams, III | H03H 15/00 341/144 |
| 7,069,284 | B2 | * | 6/2006 | Peting | H04L 1/0054 708/300 |
| 7,139,146 | B2 | * | 11/2006 | Hiura | G11B 20/10009 360/39 |
| 7,869,550 | B2 | * | 1/2011 | Batruni | H03H 21/0012 375/232 |
| 8,041,757 | B2 | * | 10/2011 | Batruni | H04L 25/03038 708/313 |
| 2006/0092057 | A1 | * | 5/2006 | Slavin | H03M 1/0626 341/118 |
| 2008/0082597 | A1 | * | 4/2008 | Batruni | H04L 25/03038 708/322 |
| 2011/0099213 | A1 | * | 4/2011 | Snelgrove | H03H 17/0219 708/3 |
| 2011/0314074 | A1 | * | 12/2011 | Batruni | H04L 25/03038 708/311 |

OTHER PUBLICATIONS

Snelgrove, William Martin: U.S. Appl. No. 13/001,042, Entitled, "System and Method of Processing a Signal With Filter Employing FIR and IIR Elements".
Snelgrove, William Martin: PCT Application PCT/CA2009/000865, filed Jun. 23, 2009, Entitled, "System and Method of Processing a Signal With Filter Employing FIR and IIR Elements".
Snelgrove, William Martin: U.S. Appl. No. 61/074,732, filed Jun. 23, 2008, Entitled, "System and Method for Controlling a Process and/or System With a Controller Employing FIR and IIR Elements".

* cited by examiner

*Primary Examiner* — David H Malzahn

(74) *Attorney, Agent, or Firm* — Perry + Currier Inc.

(57) ABSTRACT

A system and method for processing a signal with a filter employing FIR and/or IIR elements. The required controller function is decomposed into primary FIR and/or IIR elements and a compensation filter is provided to address the latency in the primary elements, which would result in undesired operation of the filter. Several configurations of suitable filters are discussed, including multi-rate filters and filters with reduced power requirements.

4 Claims, 8 Drawing Sheets

SYSTEM AND METHOD FOR PROCESSING A SIGNAL WITH A FILTER EMPLOYING FIR AND IIR ELEMENTS

RELATED APPLICATIONS

This application is a continuation of U.S. patent application Ser. No. 13/001,042, filed Dec. 22, 2010, which is a National Phase Application of PCT/CA2009/00865, filed Jun. 23, 2009, which claims priority from U.S. provisional patent application, Ser. No. 61/074,732, filed on Jun. 23, 2008 and the entire contents of which are incorporated herein by reference.

FIELD OF THE INVENTION

The present invention relates to a system and method for processing a signal with a filter. More specifically, the present invention relates to a system and method for processing a signal with a filter, where the output of the processing is sensitive to latency in the filter.

BACKGROUND OF THE INVENTION

In many circumstances, it is desirable to process signals in digital form if possible, because operations on digital data are essentially perfectly reproducible from one circuit to another whereas, by contrast, analog circuits are corrupted by a variety of practical imperfections (eg. —offsets, thermal noise, signal coupling, distortion, etc.). Accordingly, analog circuits are practical for simple functions, but digital circuits are preferred where complexity is high.

Digital representations of analog signals are sampled at discrete times, whereas analog signals vary continuously. The act of sampling a signal, in itself, delays it; converting it between analog and digital forms involves a series of steps, each delaying the signal; and processing signals comprises a sequence of computations, each of which delays the signal further. A typical digital signal processing system might delay the signal, for example, by ten samples from input to output.

The Nyquist-Shannon sampling theorem shows that the minimum sampling rate required for any sampled system relates to its bandwidth—in a simple case sampling should be at least twice as fast as the bandwidth of the signal. CD audio, for example, is sampled at forty-four point one Hz in order to reproduce twenty kHz of signal, with approximately ten percent of "over-sampling" to make smoothing filters practical. Ten samples of delay at this rate would be over two hundred microseconds.

A known technique for reducing the computational load or power consumption of a filtering system is to decimate the input signal, filter at the resulting reduced rate, and then interpolate the filtered signal back to the original rate. Decimation is usually mathematically described as lowpass filtering (to remove high-frequency energy in the input signal) followed by sub-sampling, but is often implemented with a polyphase filter. A particularly efficient special case is the $sinc^k$ filter, as described in chapter 13 of "Delta-Sigma Data Converters: Theory, Design and Simulation" by Norsworthy, Schreier and Temes, (IEEE Press) and other references.

Interpolation is similarly mathematically described as the insertion of zero-value samples to increase the data rate followed by a filtering operation to smooth the output. There are several known efficient techniques and, as with decimation, sinc filtering is particularly efficient. As will be apparent, these decimation and interpolation processes delay the signal.

In the area of linear control theory a "plant", which can be any given physical system, is controlled with a feedback system by measuring the output of the plant, comparing that to a desired output, and feeding the difference back to the input of the plant through some filtering function designed so that the plant output will track the desired output.

A fundamental limitation of these feedback controller systems is the well known "Bode integral": a classical theorem in linear control theory that states that feedback can only reduce interference at some frequencies by worsening it at others. The improvement, in deciBels, is at best zero when integrated over frequency. The practical situation is even worse when the "plant" is non-minimum phase, e.g. because it contains significant delay.

For example, in "Control System Design, Lecture Notes", K. J. Astrom, (http://www.cds.caltech.edu/~murray/courses/cds101/fa02/caltech/astrom.html), Astrom gives a relationship $\omega_{gc} T_d \langle 0.4$ between delay time $T_d$ and the loop-gain crossover frequency $\omega_{gc}$ above which control is substantially ineffective. A controller implemented with a technology that produces delay, e.g. from latency in converting between analog and digital forms, will inherently suffer in performance compared to a similar quality controller with less delay.

Continuing the above-mentioned numerical example for CD audio, a controller that has ten microseconds of delay would have $\omega_{gc} \langle 40$ krad/s and be substantially uncontrolled above six kHz. The hundreds of microseconds implied for a CD-rate system above would be completely unacceptable.

Latency in a digital controller system can also be a problem for systems that do not use feedback. For example, noise-canceling headsets using adaptive transversal digital filters are described by Widrow in the article "Adaptive Noise Canceling Principles and Applications" (IEEE Proceedings, vol. 63 no. 12, December 1975).

These are feed forward control systems: they sample the interference with microphones outside the headset, estimate the impulse response (or, equivalently, the frequency response) from this interference to a sensor microphone between the loudspeaker and the ear; and synthesize a canceling signal which is then applied to the loudspeaker. In the practical case there is a frequency-dependent response from the loudspeaker to the sensor microphone, which will limit the accuracy of cancellation unless compensated.

Latency in implementing a canceller can mean that the "time of flight" of the interfering sound wave from the external sensor to the loudspeaker is less than the latency of the control system: thus interference can pass the loudspeaker before the canceller can react.

U.S. Pat. No. 4,455,675 to Bose et al. discloses the use of an active feedback controller to reduce acoustic noise leaking into a headphone, where it is well known in control theory that interference appearing at the feedback point will be reduced by a factor $$\frac{1}{(1 - L(s))},$$

where loop gain L(s) is the product H(s)C(s) of a term H(s) due to the "plant" (which models physical resonances and delays in the loudspeaker, microphone and in the acoustic and electronic signal paths) and a term C(s) due to the controller. The controller is typically implemented as an analog circuit. Feedback is a robust method of noise reduction in that, unlike with feed forward implementations, there is little sensitivity to the gains of microphones or the loudspeaker.

Controller design for active noise cancellation using pure feedback is difficult in the frequency range at which the human ear canal resonates because the transfer function changes rapidly and unpredictably with frequency in this range. In practical systems, this is mitigated by mechanical absorption of these frequencies in heavy earpieces or by marketing the problem as a feature. The principal advantage of these systems over digital cancellers, such as described by Widrow (discussed above), was that the analog filters are compatible with low-power operation.

As a further example, public address systems, megaphones, feed forward noise cancellers and hearing aids all have performance limited by an undesired acoustic feedback path from their loudspeaker outputs back to their microphones. This path, combined with the intended "forward gain" path from their microphones to their loudspeakers, creates a feedback loop that distorts the frequency response of the system and can even make it oscillate ("howl"). A good way to control this problem is to add an electronic feedback path that models and cancels the acoustic feedback path.

However, if it is desired to implement the model and cancellation digitally, the problem of latency in the digital filters again arises.

Similar problems arise in other applications, for example in on-channel radio repeaters where a radio signal is received at one antenna and retransmitted at another at the same frequency, where reflections from objects in the vicinity of the repeater can cause undesired feedback paths with very short "times of flight".

Digital feedback controllers for mechanical systems are also well known: for example most modern jet aircraft use digital control to manage their flight surfaces. As mechanical systems become smaller, their natural frequency responses become faster and latency becomes more difficult to manage—and simultaneously power constraints become tighter, making "brute force over-sampling" less practical. Read/write heads in disk drives, for example, are mechanically positioned and a feedback controller is used to maintain their centering on a desired track. The natural frequencies of these systems are on the order of kilohertz, making controller latencies on the order of tens of microseconds troublesome.

The emergence of micro-electromechanical systems (of which accelerometers are perhaps the best-known present example) moves the resonances of physical systems up into the megahertz range, so that controller latencies must be kept in the nanoseconds.

Johns and Lewis ("IIR Filtering on Sigma-Delta Modulated Signals", Electronics Letters v. 27 no. 4 pp. 307-308, Feb. 14 1991) teach directly filtering delta-sigma modulated signals at an over-sampled rate to minimize latency and hardware complexity. Since latency is well known to be a key difficulty for feedback implementations of active noise reduction, it is apparent that the technique can be profitably applied.

The Johns and Lewis idea can be seen as having two components: over-sampling and delta-sigma modulation. Latency is reduced by over-sampling for the simple reason that data converters delay signals by some number of samples, so that faster sampling naturally reduces latency. Delta-sigma modulation is a technique of representing over-sampled signals so that errors from quantization to a finite number of bits are concentrated at frequencies outside the band of interest. This mitigates the increase in hardware complexity that would otherwise result from over-sampling.

A typical system using this technique might increase sampling rate by a factor of sixty-four to something on the order of three MHz, but reduce the number of bits processed from sixteen to one. The net effect is a complexity increase of approximately a factor of four in exchange for a latency reduction by a factor of sixty-four.

When the physical system being modeled contains a pure transport ("time of flight") delay, such as that for sound propagation from one acoustical component to another in the headphone example above, over-sampled systems allow for efficient modeling, however Nyquist-sampled systems need several taps to perform interpolation when the physical system has a delay that is not an integer number of samples.

The technical and academic literature teaches filtering in the delta-sigma domain for the case of fixed-coefficient filters. It is known that adaptive filtering is difficult with delta-sigma signals because the nonlinear operations (such as multiplying signals) required by adaptive algorithms mix out-of-band quantization noise energy into the signal band.

Feed forward systems are usually based on transversal filters, which require adjustment of one "tap" coefficient for every sample. Increasing the sampling rate increases the number of taps, and also rapidly reduces the rate at which an adaptive system converges (because there are more adjustments to make, and they also interact more strongly). Thus over-sampling is usually contraindicated in adaptive systems, and (as per the previous paragraph) particularly so for delta-sigma over-sampled systems. Over-sampling may also be impractical for wideband systems, where sampling rates are already high.

Delta-domain filtering may also be impractical in cases where cascades of sections having a high-pass or notch character are required, because in these cases the high-frequency noise generated by each section propagates through all following high-pass or notch sections, thus limiting the gain available for the system and wasting dynamic range.

Gao ("Adaptive Linear and Nonlinear Filters", Ph.D. thesis, University of Toronto November 1991) showed mathematically how to adapt coefficients of recursive (infinite impulse response or "IIR", in casual usage) filters, and gave an example of how these principles could apply to feed forward linearization of loudspeakers. It is known to be difficult to adapt IIR filters for two key reasons: the search space may have local minima; and there is a danger of instability during adaptation. On the other hand adaptive IIR filters model resonances efficiently, whereas transversal filters are more efficient at modeling transport delays and short impulse responses. Gao also teaches the use of adaptive IIR modeling of loudspeakers to improve their linearity.

Gao's technique of adapting IIR filters uses "backpropagation" of desired signals through filter blocks with a response inverse to the forward path, and allows cascade structures to be adapted. However, the backpropagation technique frequency-weights the signal minimized, which in the presence of interferers can cause misadjustment.

Johns ("Adaptive Analog and Digital State-Space IIR Filters", Ph.D. dissertation, University of Toronto 1989) also teaches adaptation of IIR filters. He shows a general method which is computationally intensive but applies to a very general class of IIR filter designs, and simpler "single-column" and "single-row" variants that apply in special cases.

Johns also teaches use of analog and digital simulations of singly-terminated LC ladder filters to obtain desirable dynamic-range properties in fixed filter designs (for the special case of spectrally white inputs), and shows that basing single-row and single-column adaptive filters on these single-terminated structures gives good performance in the case where a good initial approximation is available to the desired IIR filter transfer function.

Accordingly, it is known that both feedback and feed forward techniques are sensitive to processing latency, which has made digital implementation of controllers difficult; but analog implementations of controllers are severely limited in the complexity that they can handle and hence their performance is limited and they also have high manufacturing costs.

Delta-sigma techniques promise reduced latency, which helps to make digital implementation of feedback control systems practicable, but may worsen adaptation and the complexity of feed forward control systems.

It is desired to find a method of reducing the latency of digital signal processing for filters without being forced to the high over-sampling ratios and computational penalties of delta-sigma processing, and in which adaptive filtering is not compromised by out-of-band noise.

SUMMARY OF THE INVENTION

It is an object of the present invention to provide a novel system and method for processing a signal with a filter which obviates, or mitigates, at least one disadvantage of the prior art.

According to a first aspect of the present invention, there is provided a filter operating on a digital signal, the filter comprising: at least one IIR element; at least one FIR element; a summer combining the output of the at least one IIR element and the output of the at least one FIR element to form an output signal with a latency less than that of the IIR element.

Preferably, the filter further comprises a sample and hold device, operating to sample and hold an analog signal, and an analog to digital converter operating on the sampled analog signal to convert the sampled analog signal to the digital signal.

According to a second aspect of the present invention, there is provided a method of constructing a filter operating on a signal to produce a desired output, the method comprising the steps of: determining a desired transfer function for the filter; decomposing the desired transfer function into a sum of at least one finite impulse response component and at least one infinite impulse response component; implementing the at least one finite impulse response component; implementing the at least one infinite impulse response component; providing a summer to sum the outputs of the at least one finite impulse response component and the at least one infinite impulse response component to produce the desired output.

According to another aspect of the present invention, there is provided a filter operating on an input signal to produce an output signal, the filter comprising: a first signal processing path for processing the input signal with a first latency to produce a first component of the output signal; and a second signal processing path having a second latency, less than the first latency, the second signal processing path providing compensation for the effect of the first latency on the output signal.

The present invention provides a system and method for controlling a process and/or system with a filter employing FIR and IIR elements. The required filter function is decomposed into FIR and IIR elements and the latency in the IIR elements, which would result in undesired operation of the filter, is mitigated by the contribution of the FIR element to the output signal. Several configurations of suitable filters are discussed, including multi-rate filters and filters with reduced power requirements.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

The present invention provides a system and a method of decomposing a desired filter response into simple low-latency components suitable for analog or over-sampled digital implementation while implementing the bulk of the digital processing with efficient arithmetic at moderate sampling rates. The technique is applicable both to fixed and adaptive filtering applications. As used herein, the term "filter" is used generically and is intended to comprise a wide range of linear systems including, without limitation, cancellers, compensators, controllers, loop filters for controllers, etc.

Figure 1:
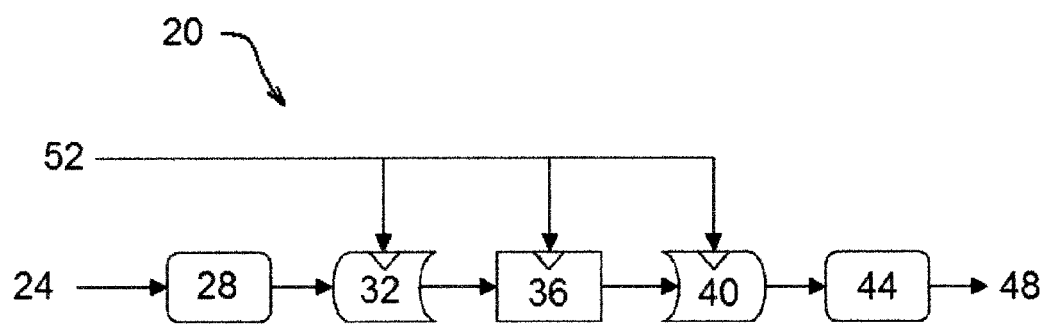
FIG. 1 shows a schematic representation of a prior art digital filter.

FIG. 1 shows a prior art filter 20 for analog signals, implemented digitally. An analog input 24 is smoothed (to avoid aliasing, according to the well-known theory of Nyquist sampling) by a smoothing filter 28, then converted to digital form using an analog-to-digital converter 32, then processed by an $N^{th}$ order digital filter 36, whose output is converted back to analog form by a digital-to-analog converter 40. The output of digital-to-analog converter 40 is typically then smoothed using a smoothing filter 44 to produce filtered output signal 48. Each of analog-to-digital converter 32, digital filter 36 and digital-to-analog converter 40 are operated in accordance with a clock signal 52.

Each of the blocks shown in the Figure delays the signal passing through it, typically by an amount on the order of the sampling time.

For example, smoothing ("anti-aliasing") filter 28 is typically required to have a cutoff frequency less than half the sampling rate, and has group delay inversely related to its cutoff frequency. Analog-to-digital converter 32 often includes a sampling circuit, which inherently delays input signals by approximately half a sample period, and multiple stages, each adding delay. The amount of delay might be one sample for a "flash" converter, as high as "R" samples for a more power-efficient R-bit pipelined converter, or M+1 samples for a higher-precision $M^{th}$ order delta-sigma converter including a simple decimation filter.

Digital filter 36 might typically be implemented as a cascade of N/2 biquadratic filters, each having one sample of delay, and hence have an overall latency of N/2, where N represents the order of the filter. Many digital filter implementation structures are known, giving the designer a range of options as to latency but perhaps at the cost of roundoff noise, stability and/or power consumption. Digital-to-analog converter 40 might typically be implemented with a collection of current sources and a zero-order hold circuit, which might be modeled as having one-half to one sample of delay. Finally, smoothing filter 44, like filter 28, will typically have a cutoff frequency set by the sampling rate and therefore group delay on the order of one sample time.

Figure 2:
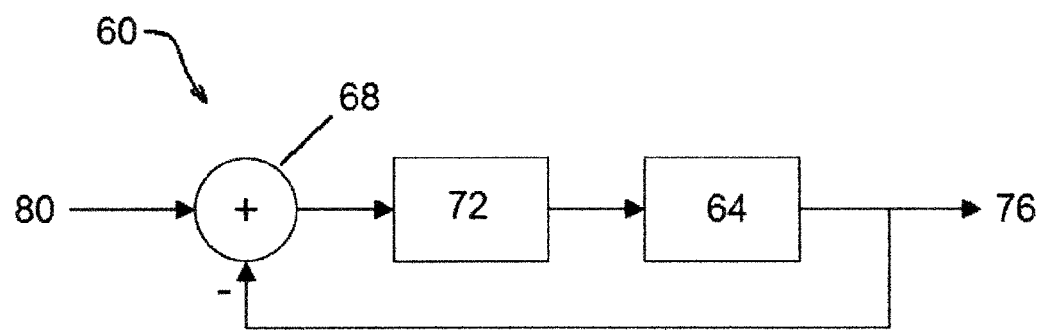
FIG. 2 shows a schematic representation of a prior art digital control loop.

FIG. 2 shows a control loop 60 comprising a plant 64, a summer 68, and a controller 72 configured to drive an output signal 76 to track an input signal 80. Control loops are well known to be sensitive to delay "around the loop". One expression of this is the Bode integral. Another is phase margin, according to the Barkhausen criterion. Phase margin is defined as the margin, at the frequency at which the magnitude of loop gain drops to unity, between the actual feedback phase and a phase of 360 degrees, which would cause oscillation. Delay around the loop causes phase to increase and so reduces phase margin.

Figure 3:
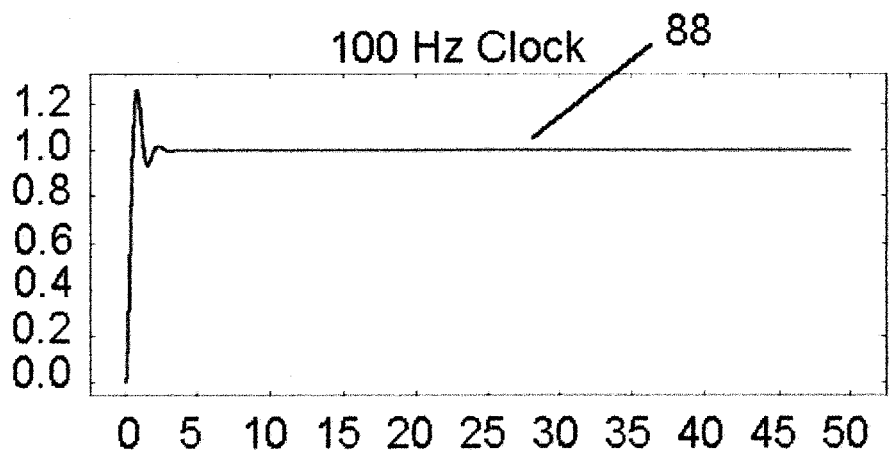
FIG. 3 shows a plot of an ideal response of a practical filter to a step input function.

FIG. 3 shows an example of the stable response 88, to a unit step input, of an exemplary feedback control system implemented with a digital controller clocked at one hundred Hz. As can be seen, after an initial overshoot, the output settles to unity—correctly tracking the input.

Figure 4:
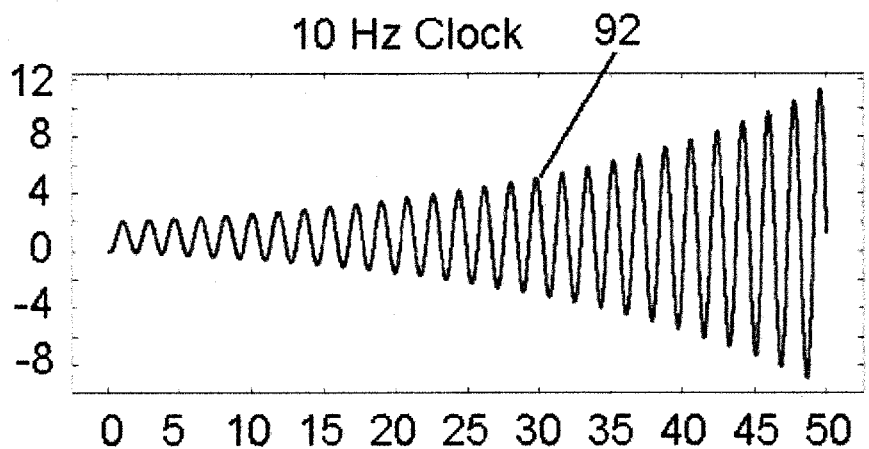
FIG. 4 shows a plot of a response of a practical closed loop filter to step input function where the filter has an undue delay in its control loop.

FIG. 4 shows the unstable response 92, to the same unit step input, of the same exemplary feedback control system implemented with a controller clocking at ten Hz. As can be seen, the response is now a growing oscillation.

Figure 5:
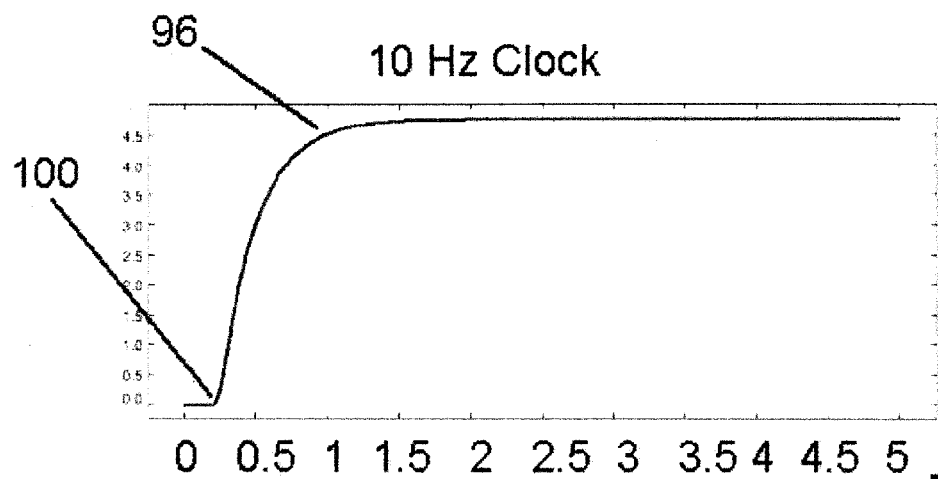
FIG. 5 shows a plot of a response of an open loop filter to a step input function where the filter has an undue delay of the signal moving through the filter.

FIG. 5 shows the impulse response 96 of the same exemplary feedback control system when the loop has been opened (i.e. —feedback signal removed) and the digital signal processing is clocked at ten Hz. There is a delay of two cycles in processing, causing there to be no response until the time 0.2 seconds, indicated by point 100.

The impulse response of the same system clocked at one hundred Hz is essentially the same, shifted to the left—without the 0.2 second delay the system is stable when the loop is closed, but with the delay it is unstable. This is a widely prevalent situation and limits the value of digital signal processing whenever a loop needs to be closed or a physical system modeled in real time.

Figure 6:
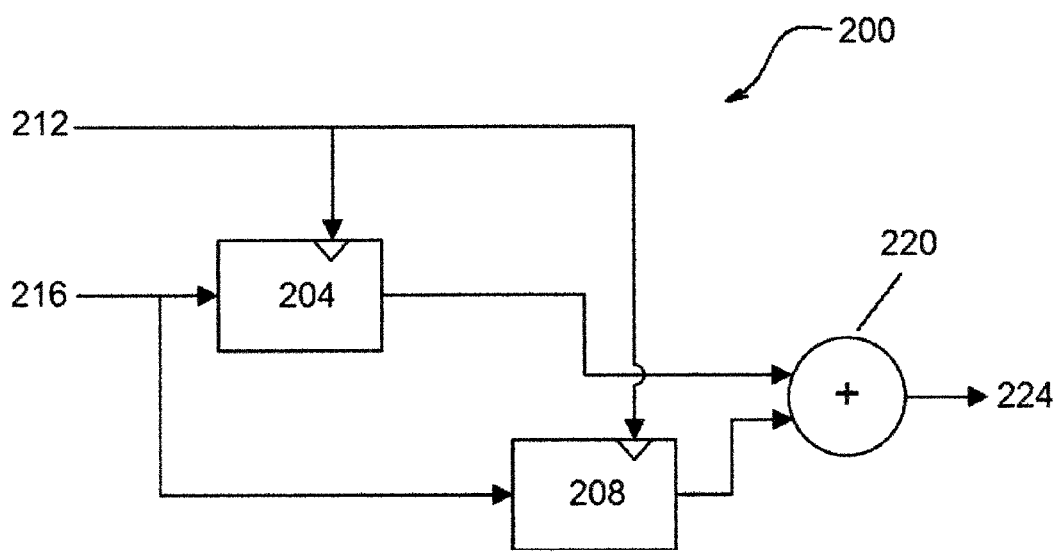
FIG. 6 shows a block diagram representation of a filter in accordance with the present invention.

FIG. 6 shows a first embodiment of a controller, indicated generally at 200, in accordance with the present invention. Controller 200 includes a combination of a first signal processing path comprising an $N^{th}$ order FIR (Finite Impulse Response) filter 204 and a second signal processing path comprising an IIR (Infinite Impulse Response) filter 208 having latency of "N" samples, the whole operable as a latency-free IIR controller 200. While in the illustrated embodiment FIR filter 204 is shown as being a digital filter, the present invention is not so limited and FIR filter 204 can be an analog filter or a combination of analog and digital elements. Similarly, in the illustrated embodiment IIR filter 208 is shown as being a digital filter, the present invention is not so limited and IIR filter 208 can be an analog filter or a combination of analog and digital elements.

Filter 200 is clocked by a clock signal 212 and operates on a digital input signal 216. While in the illustrated embodiment, clock signal 212 is shown as being the same for each of FIR filter 204 and IIR Filter 208, it will be apparent to those of skill in the art that multiple clock signals, at different rates, can be employed as is well known. Accordingly, in the embodiment of FIG. 6 and in each of the following embodiments (and as explicitly shown with reference to FIG. 9) two or more clock signals of different rates can be employed.

The outputs of FIR filter 204 and IIR filter 208 are combined by summer 220 to produce the filtered digital output 224. As will be apparent to those of skill in the art, digital input signal 216 can be converted from an analog signal by any suitable means and filtered digital output 224 can be converted to an analog signal by any suitable means.

For the special case, wherein controller 200 is a strictly proper first-order system with desired z-domain transfer function $$\frac{1}{(z-z_i)}: \quad \text{(Eq. 1)}$$

$$\frac{1}{(z-z_i)} = \frac{z^{-1}}{1-z_i z^{-1}}$$

$$= z^{-1}\left(1 + z_i z^{-1} + z_i^2 z^{-2} + \ldots + z_i^{N-1} z^{1-N} + z^{1-N} \frac{z_i^N}{z-z_i}\right)$$

which expresses the desired IIR function as the sum of an FIR filter:

$$z^{-1}(1+z_i z^{-1}+z_i^2 z^{-2}+\ldots+z_i^{N-1}z^{1-N}) \quad \text{(Eq. 2)}$$

and an IIR filter:

$$z^{-N}\frac{z_i^N}{z-z_i} \quad \text{(Eq. 3)}$$

having N samples of delay. It will be apparent to those of skill in the art that this is an exact equivalence and that the order of the IIR filter is still one, although its gain has changed (comparing the left hand side of Eq. 1 with Eq. 3), and that it still has the same pole at $z=z_i$.

This shows that, even if we can only physically construct a first-order IIR filter with an excess latency of N samples, we can modify its gain and combine it with an N-tap FIR filter to get a desired latency-free IIR response (the Left hand side of Eq. 1). The formulae show how to calculate the coefficients for the FIR filter 204 (Eq. 2) and how to modify the gain of the IIR sub-filter 208 (Eq. 3).

Generalizing this, any causal transfer function can be written in residue form:

$$H(z) = b_0 + \sum_{i=1}^{M} \frac{a_i}{z-z_i}$$

which can be decomposed as $H(z)=H_{FIR}(z)+H_{IIR}(z)$ into an FIR term of order N $$H_{FIR}(z) = b_0 + \sum_{j=1}^{N} b_j z^{-j}$$

whose coefficients are $$b_j = \sum_{i=1}^{M} a_i z_i^j$$

and an IIR term $$H_{IIR}(z) = z^{-N}\sum_{i=1}^{M}\frac{a_i z_i^N}{z-z_i} \quad \text{(Eq. 4)}$$

As will be apparent, the IIR term has the same order and poles as the original filter, but its residues are scaled by constant factors $z_i^N$. It is unusual to express a transfer function in residue form, but routine mathematical operations can be used to express $H_{IIR}(z)$ in more familiar forms, such as a ratio of polynomials in coefficient or root forms. In these terms, the poles of $H_{IIR}(z)$ are the same as those of the desired $H(z)$ but the zeros are different and Eq. 4, together with routine algebra, describes the difference precisely. There is an extensive literature on the next step, which is implementing these functions in digital signal processing.

The decomposition $H=H_{FIR}+H_{IIR}$ is always an IIR filter, but has more degrees of freedom than a canonic $N^{th}$ order filter. Specifically, the FIR taps can be set according to the formula above for $b_i$, but can also be set arbitrarily.

As will now be apparent, by combining FIR filter 204 with IIR filter 208, the delay (shown in FIG. 5) in the response of prior art controllers, such as controller 20, can be mitigated. Specifically, the output of FIR filter 204 is used to at least partially compensate for the delay in the response of IIR filter 208 to provide an overall closed-loop response which more closely approximates an ideal response, such as that shown in FIG. 3. Thus, one of the elements (FIR and/or IIR elements) of filter 200 serves to compensate for the delay of one or more of the other elements of filter 200.

Figure 7:
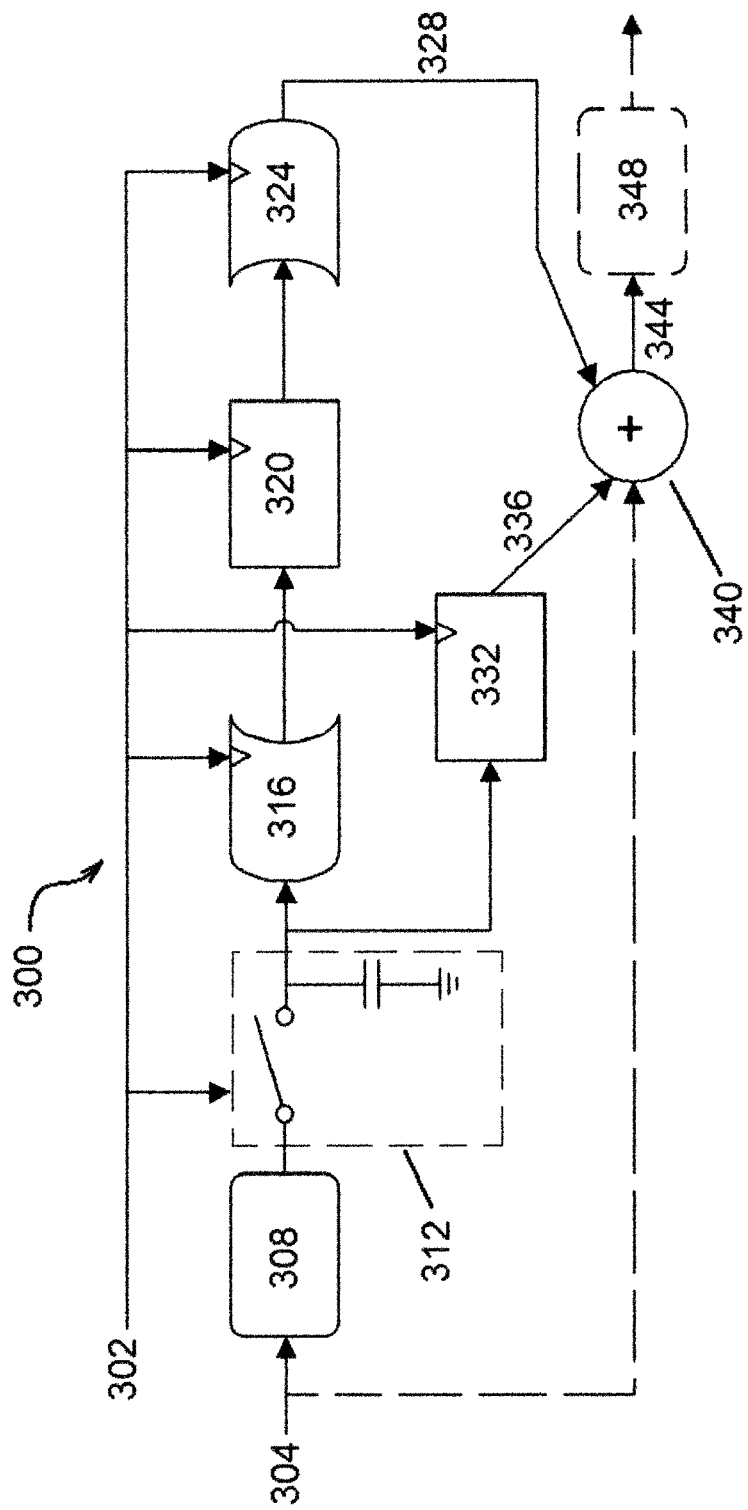
FIG. 7 shows a block diagram representation of another filter in accordance with the present invention.

FIG. 7 shows another embodiment of a controller, indicated generally at 300, in accordance with the present invention which is clocked by a clock signal 302. An analog input 304 is smoothed by a smoothing filter 308, then converted to sampled form using a sample/hold circuit 312. The resulting sampled signal is then converted to digital form, using analog-to-digital converter 316, and is then processed by a digital filter 320. The output from digital filter 320 is then converted back to analog form by a digital-to-analog converter 324 to form a first partial sum 328.

The sampled signal from sample/hold circuit 312 is also processed through an FIR filter 332 to produce a second partial sum 336.

Partial sums 328 and 336, and optionally a copy of analog input 304, are weighted and summed in a summer 340 to produce output signal 344. If desired, output signal 344 can be smoothed by a smoothing filter 348.

Referring to the mathematical decomposition $H=H_{FIR}+H_{IIR}$ above, we can identify weighted summer 340 as implementing various terms. Thus, $b_0$ is implemented by suitably weighting the input of analog input signal 304 to summer 340; analog FIR filter 332 can be seen as implementing the delayed terms of $H_{FIR}$; and the output of D/A converter 324 can implement the delayed IIR function $H_{IIR}(z)$. Recursively, digital filter 320 may itself be decomposed in this fashion, as was described above with respect to FIG. 6.

The resulting system would then comprise a purely digital IIR filter 208 and an FIR filter, in turn comprising an analog FIR component 332 and a digital FIR component 204.

It is believed that the present invention provides particular advantages when employed with adaptive filters, where latency is otherwise an issue. In particular, cascaded combinations of FIR and IIR filters can be adapted by adding suitably configured adjoint filters to estimate gradients. By choosing the structure of the IIR filter appropriately, it can be arranged that the order of the gradient filter is no greater than that of the signal-path filter. It is known to those of skill in the art that these gradient filters can often be operated intermittently, thus saving power, if desired.

Figure 8:
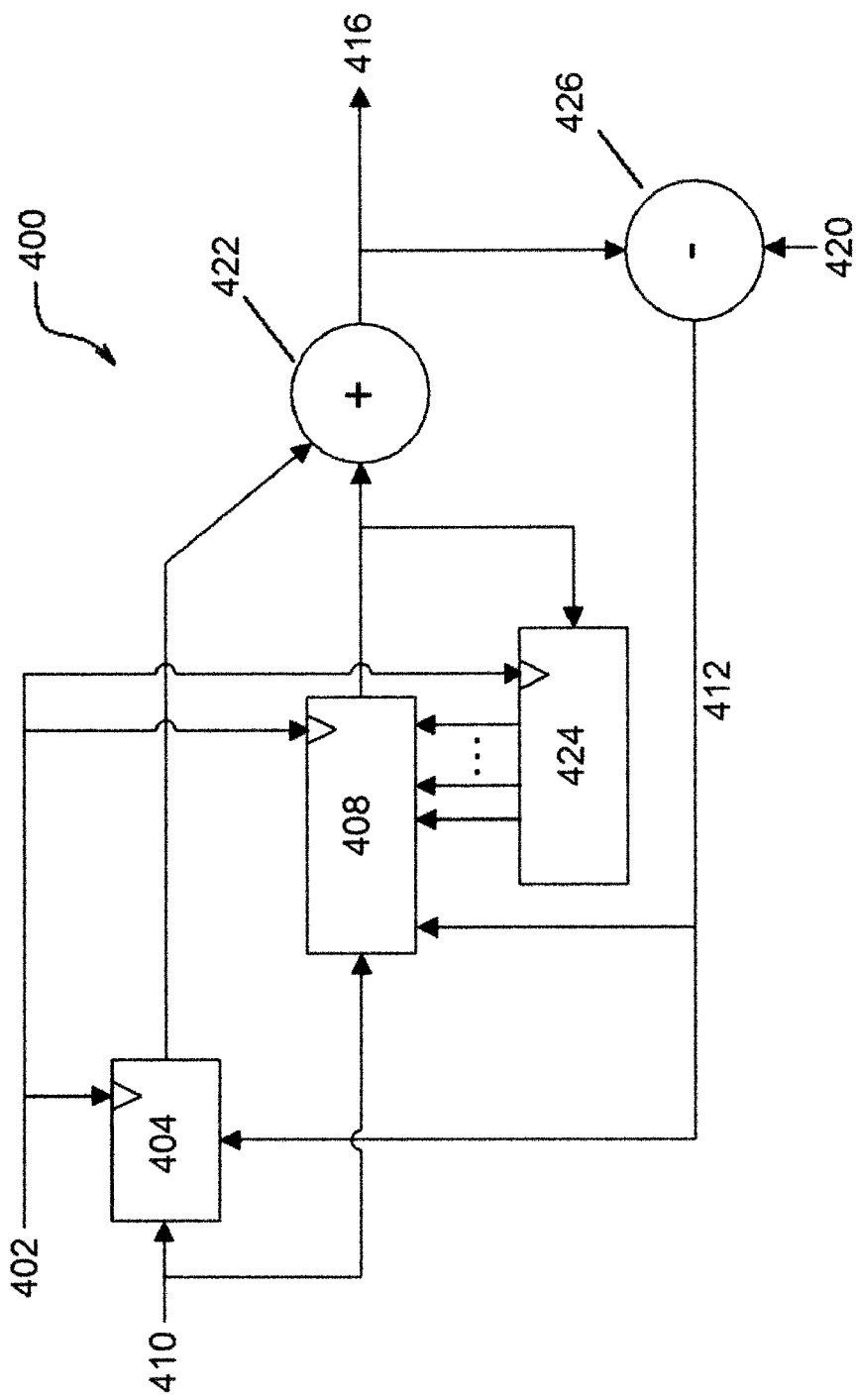
FIG. 8 shows a block diagram representation of another filter in accordance with the present invention.

FIG. 8 shows another embodiment of a controller 400 in accordance with the present invention. Controller 400 is clocked by a clock signal 402 and employs an adaptive combination of an $N^{th}$ order FIR filter 404 with an IIR filter 408 having latency of N samples, the whole operable as a latency-free adaptive IIR filter/controller 400 operating on an digital input signal 410 to produce a filter digital output signal 416. A summer 422 combines the output of FIR filter 404 and the output of IIR filter 408 to produce a digital output signal 416.

Filter 400 is operable to minimize an error signal 412 constructed by subtracting the digital output signal 416 from a reference signal 420 (which may in some implementations be zero) with a subtractor 426. FIR filter 404 can be adapted by known algorithms, such as the least mean-square (LMS) algorithm, while IIR filter 408 can independently be adapted by known methods, such as those methods discussed in the PhD theses of Johns and Gao (discussed above). These methods can, in general, require an auxiliary gradient filter 424.

The LMS algorithm is known to be capable of adapting analog filters. Thus the adaptive technique of FIG. 8 can be used for either analog or digital FIR taps as discussed above with reference to FIG. 7.

As noted above, the combined FIR/IIR system can exactly simulate a latency-free IIR filter of order N, but has more degrees of freedom. An adaptive FIR/IIR combined system can in general be expected to converge to some value not constrained to simulate a canonic $N^{th}$ order IIR.

Figure 9:
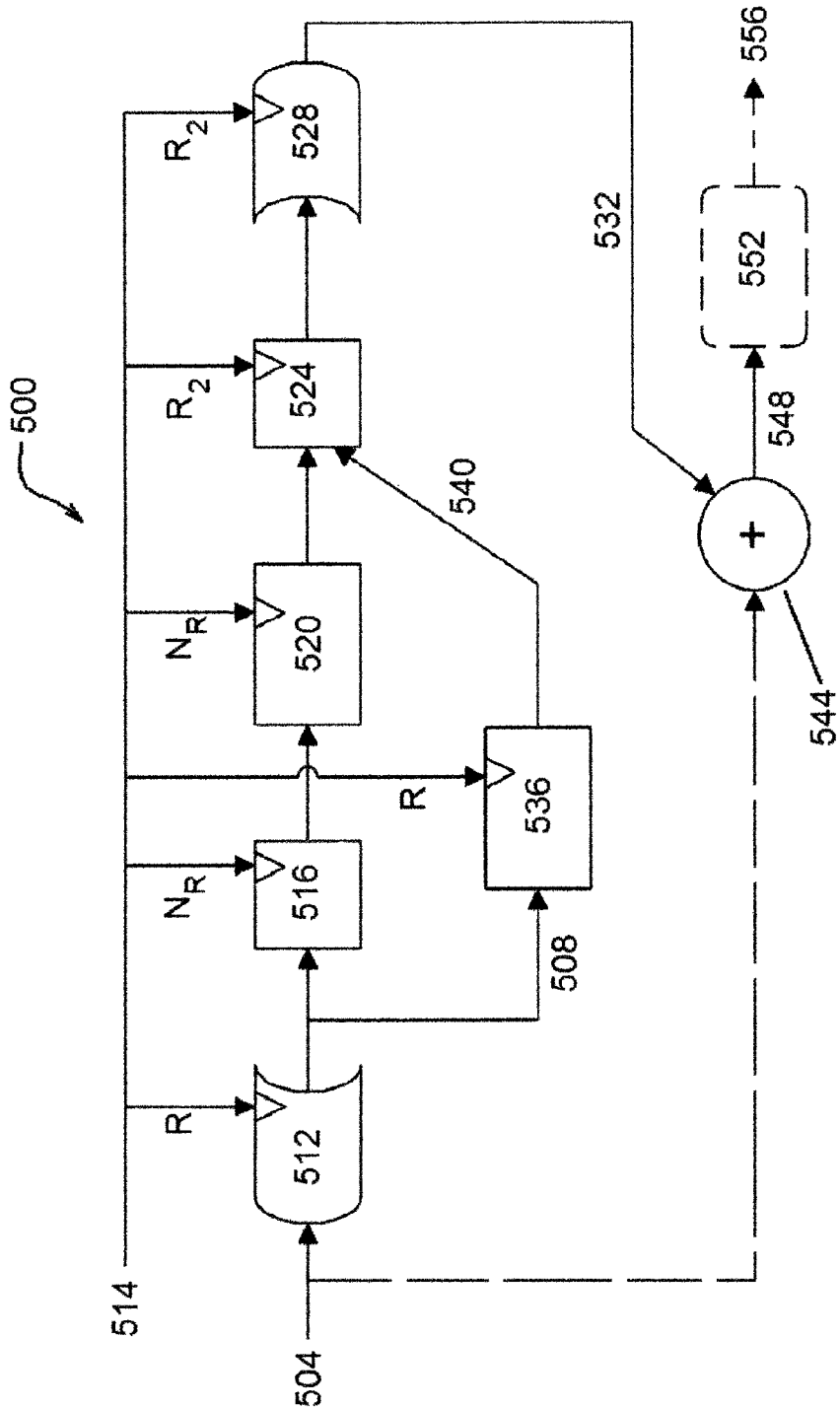
FIG. 9 shows a block diagram representation of a multi-rate filter in accordance with the present invention.

The techniques disclosed above can also be extended to multi-rate signal processing. FIG. 9 shows a multi-rate embodiment of a controller 500 in accordance with the present invention. An analog input 504 is converted to an over-sampled form 508 using an over-sampled analog-to-digital converter 512. A clock signal 514 at the Nyquist rate ($N_R$) for input 504 is supplied to analog-to-digital converter 512, which operates at a multiple (R) of the rate $N_R$ ($R>N_R$) to over-sample signal 504.

The over-sampled output 508 of analog-to-digital converter 512 is then processed by a decimator 516 and a low-rate digital filter 520, whose output is optionally converted back to an over-sampled rate by interpolator 524 which can employ the same, or a different multiple of clock signal 514 to operate at a rate $R_2$, where $R_2 \geq N_R$.

The output from low-rate digital filter 520 is applied to interpolator 524, along with the output 540 from FIR filter 536. These two signals are summed by interpolator 524 whose output is then converted to analog form 532 by digital to analog converter 528. If $R_2$ is greater than $N_R$, then signal 532 from analog to digital converter 528 is an oversampled version.

In one configuration, over-sampled FIR filter 536 can be constrained to have non-zero tap weights spaced at the sampling interval of low-rate digital filter 520. In this case, the tap weights can be chosen according to the method described above with reference to FIG. 6 and an arbitrary delay can be compensated for. For example, if FIR filter 520 operating at the Nyquist rate ($N_R$) is designed to have tap values of [1, −3, 5] and if R is two times $N_R$, then tap values of [0, 1, 0, −3, 0, 5] can be employed with FIR filter 536.

Thus, the taps of over-sampled FIR filter 536 could be convolved with the sequence [0.25, 0.5, 0.25] (shifted to have its peak at time offset 0) producing an FIR with taps {0.25, 0.5, −0.5, −1.5, 0.5, 2.5, 1.25}. This filter is more computationally expensive to implement, having more non-zero taps, but filters out substantial high-frequency noise.

In another configuration, tap weights for over-sampled FIR filter 536 can be designed as a convolution of tap weights, as described above with reference to FIG. 6, with an interpolating function having zero group delay. This requires more computation, but filters out aliases and high-frequency noise such as might be expected if over-sampled A/D converter 512 is implemented as a delta-sigma modulator.

In another configuration, second partial sum 540 can be converted to analog form separately from the output of digital filter 520 and summed into summer 544, as will be apparent to those of skill in the art.

In another configuration, FIR filter 536 and low-rate digital filter 520 can be jointly adapted, as described for above with reference to FIG. 8.

FIG. 9 shows FIR filter 536 as a single block running at the over-sampled rate R. Such an implementation can often require a large number of memory elements operating at the over-sampled rate. As will be apparent, the first tap of such an FIR filter needs to have very low latency, but the second tap can tolerate one more sample of latency, the third tap can tolerate two more, and so on.

Thus, the present inventor has determined that it is possible to implement later taps with lower-speed circuitry despite the latency inherent in operating at lower speeds. This can be done for the second tap by moderately decimating the over-sampled input signal to produce a signal at a lower rate but with only one sample of latency. Similarly, the third tap could be implemented by decimating further to further reduce the computation rate at the cost of one additional sample of latency; and so on.

Figure 10:
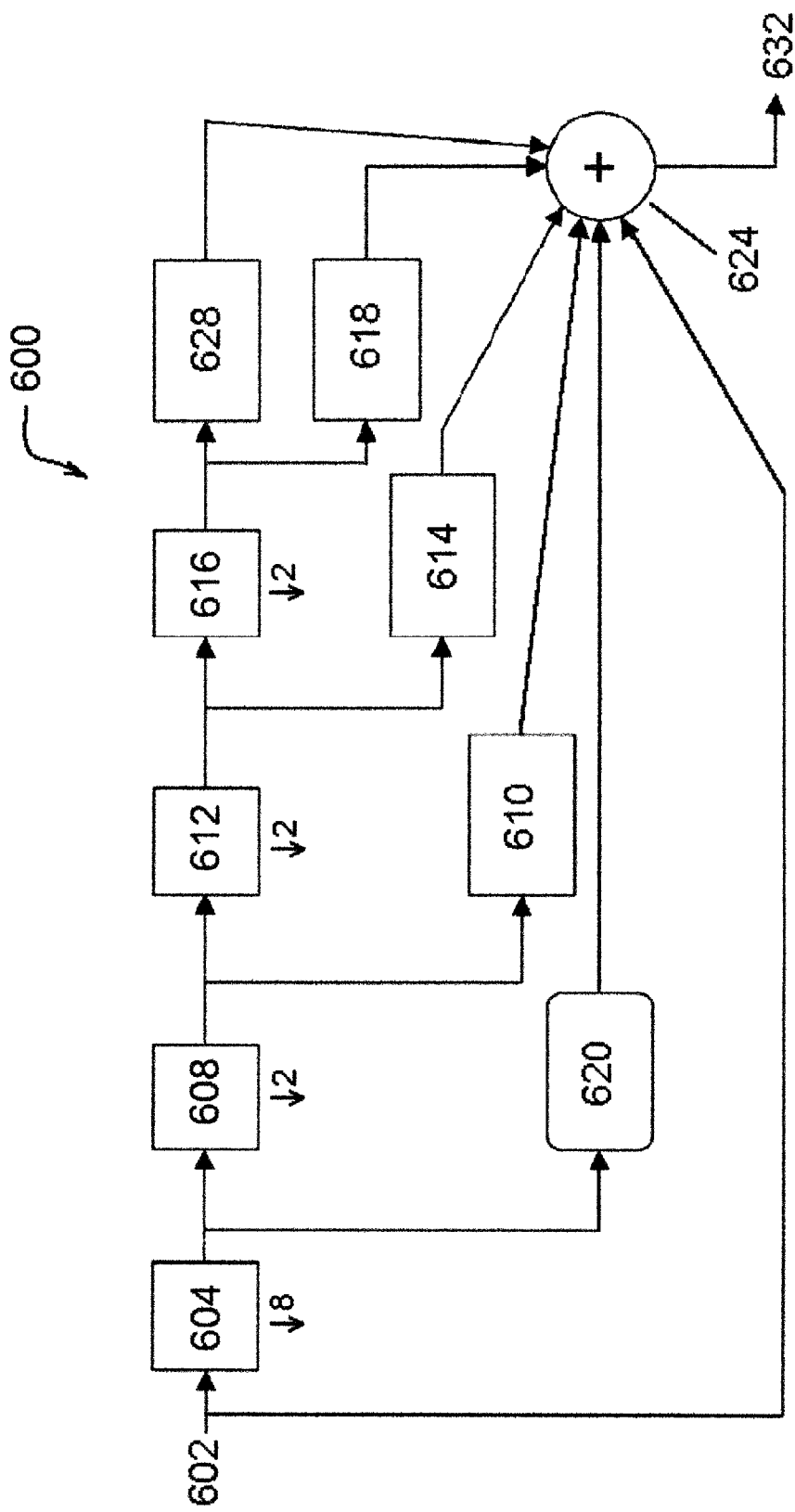
FIG. 10 shows a block diagram representation of an implementation of a filter in accordance with the present invention.

In practical systems, this cascade of simple decimators already exists. Specifically, a high-order decimator is commonly implemented as a cascade of simpler decimators, for efficiency. FIG. 10 shows an example of a filter 600 for an embodiment of a controller in accordance with the present invention which employs such a decimation scheme.

In filtering block 600, decimation of the digital input 602 by a factor of sixty-four is obtained by decimating with a first decimator 604 by a factor of eight. This can be achieved, for example, with a sinc$^N$ filter, where N is a sufficiently high order to manage aliasing of signal 602. The signal is then successively decimated by a factor of two by each of decimators 608, 612 and 616 which can be implemented, for example, as half-band or general FIR filters. If a zero-delay tap is required, it can be taken directly from the over-sampled input.

The second tap can tolerate a latency of sixty-four samples at the over-sampled rate, whereas (for example) a fourth-order sinc$^N$ filter that decimates by a factor of eight has sixteen samples of group delay (which acts like latency) at the over-sampled rate and produces samples at eight times the over-sampled rate. Thus, delaying by an additional six samples of the output of decimator 604 will produce a sample at the desired delay for the second tap and delay 620 performs this function.

The process of design proceeds in a straightforward fashion. Each of the decimators has a certain group delay, and is not suitable for taps requiring latency lower than that respective certain group delay whereas, for efficiency, it is preferred that each tap be implemented using the lowest-rate signal available.

In the implementation of FIG. 10, taps two, three and four (indicated as 610) can be implemented using the output of decimator 608; taps five through ten (indicated as 614) using the output of decimator 612; and taps eleven through twenty (indicated as 618) using the output of decimator 616.

All of these taps, or FIR filters implementing combinations of taps, can be summed using a summer 624, which can also add in the partial sum resulting from an IIR filter 628.

As will be apparent, summer 624 takes in input signals at several distinct rates to produce digital output signal 632. One implementation of summer 624 can hold low-rate signals, forming a sum at any time with all available signals, or it can sum only signals that become available at any given clock cycle, leaving later stages in the system (such as the D/A converter—not shown) to do the required averaging.

Filters implemented at reduced rates through the use of decimation and interpolation are known to be time-varying, with impulse responses varying slightly according to the phase of the decimation clock. By designing the compensating filter elements to have a complementary variation with clock phase a better approximation can be made to the ideal full-rate system. In the following discussion the compensating element is an FIR filter, but it will be apparent to those of skill in the art that the compensating element can, in some instances, be an IIR filter.

Figure 11:
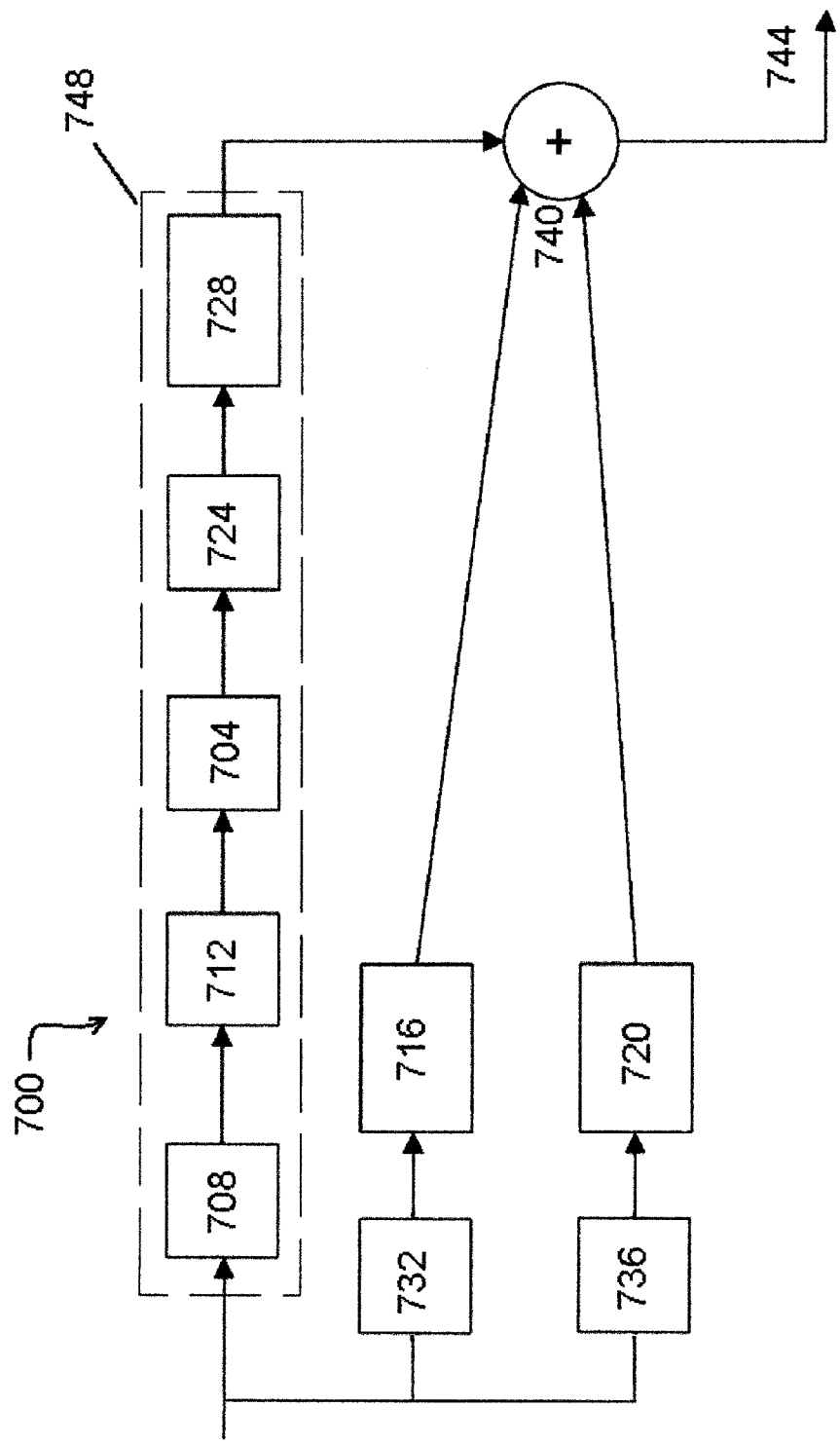
FIG. 11 shows a block diagram representation of another filter in accordance with the present invention.

In FIG. 11 another embodiment of a controller in accordance with the present invention is indicated generally at 700. In controller 700, a desired response is formed using a first signal processing path comprising a low-rate (operating at half the input rate) IIR filter 704, using sinc$^k$ decimation, where k is sufficient to manage the aliasing, comprising smoother 708 and downsampler 712, and a second and third signal processing path each comprising a polyphase FIR filter (716 and 720 respectively). FIR filters 716 and 720 correct for the latency resulting from the decimator (smoother 708 and downsampler 712) and upsampler 724 and interpolator 728 surrounding the low-rate IIR 704

FIR filter 716 operates only on even-numbered samples of the input, as provided by even sample downsampler 732, while FIR filter 720 operates only on odd-numbered input samples, as provided by odd sample downsampler 736, but in combination both filters 716 and 720 contribute to every sample of the output.

The processed output from low-rate IIR filter 704 is applied to a summer 740, as are the outputs from FIR filter 716 and FIR filter 720 to obtain output signal 744.

If, for example, the polyphase FIR filter operating on even sampled inputs has an, impulse response {a, b, c, d}, while the polyphase filter operating on odd sampled inputs has an impulse response {e, f, g, h i}, then their summed outputs may be written in the matrix form $$\begin{bmatrix} y_{2n+1} \\ y_{2n+2} \end{bmatrix} = \begin{bmatrix} a & c \\ b & d \end{bmatrix} \begin{bmatrix} x_{2n} \\ x_{2n-2} \end{bmatrix} + \begin{bmatrix} 0 & f & h \\ e & g & i \end{bmatrix} \begin{bmatrix} x_{2n+1} \\ x_{2n-1} \\ x_{2n-3} \end{bmatrix}$$

It will be apparent to one skilled in the art that this technique may be generalized to other decimation rates: if the IIR path is implemented at a rate downsampled by some factor N, then N FIR filters could be used, each clocking on a distinct phase of the divided clock and each contributing to every output sample.

Table 1 shows an example wherein IIR filter 704 is an integrator having gain $$\frac{1}{z-1}$$

at the reduced sampling rate, interpolator 708 is a sinc$^2$ filter having an impulse response (0.5, 1, 0.5), downsampler 712 is a rate two downsampler, upsampler 724 is a rate two upsampler and interpolator 728 is a sinc$^1$ filter having impulse response (1,1). The table shows the result of an impulse input being applied at an even sample time (time 0):

TABLE 1

| Signal | Time | | | | | | | | | | | |
|---|---|---|---|---|---|---|---|---|---|---|---|---|
| | −3 | −2 | −1 | 0 | 1 | 2 | 3 | 4 | 5 | 6 | 7 | 8 |
| Ideal case | | | | | | | | | | | | |
| Input | 0 | 0 | 0 | 1 | 0 | 0 | 0 | 0 | 0 | 0 | 0 | 0 |
| ideal output | 0 | 0 | 0 | 0 | 1 | 1 | 1 | 1 | 1 | 1 | 1 | 1 |
| Even-sample case | | | | | | | | | | | | |
| Input | 0 | 0 | 0 | 1 | 0 | 0 | 0 | 0 | 0 | 0 | 0 | 0 |
| Output at 708 | | | | 0 | 0.5 | 1 | 0.5 | 0 | 0 | 0 | 0 | 0 |
| Output at 712 | | | | 0 | | 1 | | 0 | | 0 | | 0 |
| Output at 704 | | 0 | | 0 | | 0 | | 1 | | 1 | | 1 |
| Output at 724 | 0 | 0 | 0 | 0 | 0 | 0 | 0 | 1 | 0 | 1 | 0 | 1 |

TABLE 1-continued

| Signal | -3 | -2 | -1 | 0 | 1 | 2 | 3 | 4 | 5 | 6 | 7 | 8 |
|---|---|---|---|---|---|---|---|---|---|---|---|---|
| Output at 728 | | | 0 | 0 | 0 | 0 | 0 | 0 | 1 | 1 | 1 | 1 |
| Error | | | 0 | 0 | 1 | 1 | 1 | 1 | 0 | 0 | 0 | 0 |

The ideal case refers to the ideal impulse signal being applied to an ideal integrator at time 0.

As can be seen, the ideal output is an ideal step commencing at time 1.

In the Even-sample case, the error at the output at sample times 1, 2, 3 and 4 are {1, 1, 1, 1} respectively and thereafter the output is correct. Thus, FIR filter 716 requires coefficients of {1, 1, 1, 1} corresponding to the {a, b, c, d} discussed above.

Table 2 shows a similar example wherein the signal path and components are the same as was the case for Table 1, but wherein the ideal impulse input is applied at an odd sample time (time 1):

TABLE 2

| Signal | -3 | -2 | -1 | 0 | 1 | 2 | 3 | 4 | 5 | 6 | 7 | 8 |
|---|---|---|---|---|---|---|---|---|---|---|---|---|
| *Ideal case* | | | | | | | | | | | | |
| Input | 0 | 0 | 0 | 0 | 1 | 0 | 0 | 0 | 0 | 0 | 0 | 0 |
| ideal output | 0 | 0 | 0 | 0 | 0 | 1 | 1 | 1 | 1 | 1 | 1 | 1 |
| *Odd-sample case* | | | | | | | | | | | | |
| Input | 0 | 0 | 0 | 0 | 1 | 0 | 0 | 0 | 0 | 0 | 0 | 0 |
| Output at 708 | | | | 0 | 0 | 0.5 | 1 | 0.5 | 0 | 0 | 0 | 0 |
| Output at 712 | | | | 0 | | 0.5 | | 0.5 | | 0 | | 0 |
| Output at 704 | | 0 | | 0 | | 0 | | 0.5 | | 1 | | 1 |
| Output at 724 | 0 | 0 | 0 | 0 | 0 | 0 | 0.5 | 0 | 1 | 0 | 1 | |

TABLE 2-continued

| Signal | -3 | -2 | -1 | 0 | 1 | 2 | 3 | 4 | 5 | 6 | 7 | 8 |
|---|---|---|---|---|---|---|---|---|---|---|---|---|
| Output at 728 | | | 0 | 0 | 0 | 0 | 0 | 0 | 0.5 | 0.5 | 1 | 1 |
| Error | | | 0 | 0 | 0 | 1 | 1 | 1 | 0.5 | 0.5 | 0 | 0 |

From Table 2, in the ideal case, the output is still an ideal step but starts at sample time 2. In the Odd-sample case, the error at the output sample times 2, 3, 4, 5 and 6 are {1, 1, 1, 0.5, 0.5} respectively and thereafter the output is correct. Thus, FIR filter 720 requires coefficients of {1, 1, 1, 0.5, 0.5}, which correspond to the {e, f, g, h, i} discussed above.

As another example, Tables 3 and 4 compare an ideal, full rate, implementation of an IIR leaky integrator (i.e. —a low pass filter) with gain of $$\frac{1}{z - 0.9}$$

and a low rate (half speed) implementation of the IIR leaky integrator which is designed with a gain of $$\frac{1}{z - 0.81},$$

where the pole has been squared (i.e. —$0.9^2$=0.81) due to the half speed operation, and a gain correction factor of 0.59049. Referring to Equation 4 above, it will be seen that it is necessary to scale the gain of the delayed IIR path by $0.9^5$ (i.e. —0.59049). For clarity, in the case of Tables 1 and 2 above, the gain was 1, and hence the gain correction factor was 1.

The output interpolator 728 of the low rate IIR signal path in this case is a $sinc^2$ filter with an impulse response of {0.5, 1, 0.5} and the input interpolator 708 and the downsampler 712 and upsampler 724 of the low rate IIR signal path are as described above.

TABLE 3

| Signal | -1 | 0 | 1 | 2 | 3 | 4 | 5 | 6 | 7 | 8 | 9 | 10 |
|---|---|---|---|---|---|---|---|---|---|---|---|---|
| *Ideal case* | | | | | | | | | | | | |
| input | 0 | 1 | 0 | 0 | 0 | 0 | 0 | 0 | 0 | 0 | 0 | 0 |
| Ideal output | 0 | 0 | 1 | 0.9 | 0.81 | 0.73 | 0.66 | 0.59 | 0.53 | 0.48 | 0.43 | 0.39 |
| *Even-sample case* | | | | | | | | | | | | |
| input | 0 | 1 | 0 | 0 | 0 | 0 | 0 | 0 | 0 | 0 | 0 | 0 |
| Output at 708 | | 0 | 0.5 | 1 | 0.5 | 0 | 0 | 0 | 0 | 0 | 0 | 0 |
| Output at 712 | | 0 | | 1 | | 0 | | 0 | | 0 | | 0 |
| Output at 704 | | 0 | | 0 | | 1 | | 0.81 | | 0.66 | | 0.53 |
| Output at 724 | 0 | 0 | 0 | 0 | 0 | 1 | 0 | 0.81 | 0 | 0.66 | 0 | 0.53 |
| Output at 728 | 0 | 0 | 0 | 0 | 0 | 0 | 0.5 | 1 | 0.91 | 0.81 | 0.73 | 0.66 |
| error | 0 | 0 | 1 | 0.9 | 0.81 | 0.73 | 0.36 | 0 | -0 | 0 | -0 | 0 |

From the error values, FIR filter 716 can be seen to have impulse response of {0, 1, 0.9, 0.81, 0.73, 0.36}.

TABLE 4

| Signal | -1 | 0 | 1 | 2 | 3 | 4 | 5 | 6 | 7 | 8 | 9 | 10 |
|---|---|---|---|---|---|---|---|---|---|---|---|---|
| *Ideal case* | | | | | | | | | | | | |
| input | 0 | 0 | 1 | 0 | 0 | 0 | 0 | 0 | 0 | 0 | 0 | 0 |
| lowpass | 0 | 0 | 0 | 1 | 0.9 | 0.81 | 0.73 | 0.66 | 0.59 | 0.53 | 0.48 | 0.43 |

TABLE 4-continued

| Signal | -1 | 0 | 1 | 2 | 3 | 4 | 5 | 6 | 7 | 8 | 9 | 10 |
|---|---|---|---|---|---|---|---|---|---|---|---|---|
| | | | | | | Odd-phase case | | | | | | |
| input | 0 | 0 | 1 | 0 | 0 | 0 | 0 | 0 | 0 | 0 | 0 | 0 |
| Output at 708 | | 0 | 0 | 0.5 | 1 | 0.5 | 0 | 0 | 0 | 0 | 0 | 0 |
| Output at 712 | | | 0 | 0.5 | | 0.5 | | 0 | | 0 | | 0 |
| Output at 704 | | | 0 | | 0 | 0.5 | | 0.91 | | 0.73 | | 0.59 |
| Output at 724 | 0 | 0 | 0 | 0 | 0 | 0.5 | 0 | 0.91 | 0 | 0.73 | 0 | 0.59 |
| Output at 728 | 0 | 0 | 0 | 0 | 0 | 0 | 0.25 | 0.5 | 0.7 | 0.91 | 0.82 | 0.73 |
| error | 0 | 0 | 0 | 1 | 0.9 | 0.81 | 0.58 | 0.36 | 0.18 | -0 | -0 | -0 |

From these error values, FIR filter 720 can be seen to have impulse response of {0, 1, 0.9, 0.81, 0.58, 0.36, 0.18}.

In both Tables 3 and 4, the error at the tail is shown as "–0" which indicates that the value is not, in fact, exactly zero. This is a result of aliasing, and these values can be made arbitrarily small by selecting appropriate values for k, in the $sinc^k$ filters employed in the signal path, albeit it an increased cost in complexity, power consumption, etc.

In considering the error values (and corresponding coefficients) above, it will be recognized that the first few samples of the even-sample and odd-sample FIR filters are identical in these examples which implies two things: first, the similarity implies that a simple (non-polyphase) FIR filter, as disclosed earlier herein, would produce a similar output; and second, a simple (non-polyphase) FIR filter could be combined with lower-order polyphase FIR filters to obtain the same result.

Thus, one of skill in the art will recognize that the polyphase technique discussed with respect to Tables 1 through 4 is a refinement of the delay-compensation technique disclosed earlier herein.

While the advantages of the embodiment of the present invention discussed above with respect to FIG. 11 and Tables 1 through 4 may be questionable for the implementation of a first order IIR filters 704, if filter 704 is a high order filter the advantages quickly become more apparent.

In the example, filter 700 implements the desired IIR functionality in a downsampled block 748 which comprises low pass decimators (sinc filter 708 and downsampled 712) and interpolators (upsampler 724 and sinc filter 728) and IIR filter 704. Compensation for the latency of downsampled block 748 is provided by the even sample and odd sample downsamplers (732, 736) and polyphase FIR filters (716, 720).

It is known to use downsampled block 748, or the like, for implementation of lowpass filters or the arbitrary components of low pass filters and for other filters, or their arbitrary components, such as high pass filters, bandpass filters, etc., albeit with appropriate alternatives for sinc filter 708 and 728 (which act as low pass filters). One of skill in the art will understand that suitable compensation for the latency of such downsampled filters can be provided using the same techniques as described above.

One of skill in the art will also recognize that a filter may sometimes be decomposed in such a way that a part of the IIR component may be practically implemented without decimation while another part requires decimation. For example, if a filter has one pole at z=−0.5 and another at z=0.999, the highpass pole at z=−0.5 can be implemented efficiently with a simple adder and a bit-shifter which can be practical at the full sample rate, whereas an accurate implementation of the lowpass pole at z=0.999 may require a multiplier and it may be desirable to use decimation.

The design of such a system can be achieved in several ways using the techniques disclosed herein: for example by decomposing the entire filtering function into residue form, as described above, and independently designing subsystems of decimators, full-rate IIR filters and delay-compensation FIR filters as disclosed herein. In doing this the designer may encounter opportunities to simplify the resulting structure: for example, as disclosed above, when implementing several poles it is not necessary to have an FIR section for each because parallel even sample, or parallel odd sample, FIR filters can be consolidated just by adding together their coefficients.

While the discussion above refers primarily refers to the use of FIR filters to provide compensation for the latency of IIR filters, it is also contemplated that the present invention can be usefully employed with downsampled FIR filters which are compensated with other FIR filters and/or downsampled IIR filters which are compensated with other IIR filters. Suitable implementations of such FIR/FIR and IIR/IIR configurations will be apparent to those of skill in the art.

The present invention provides a system and method for controlling a process and/or system with a controller employing FIR and IIR elements. The required controller function is decomposed into FIR and IIR elements and the latency in the IIR elements, which would result in undesired operation of the controller, is mitigated by the contribution of the FIR element to the output signal. Several configurations of suitable controllers are discussed, including multi-rate controllers and controllers with reduced power requirements.

The above-described embodiments of the invention are intended to be examples of the present invention and alterations and modifications may be effected thereto, by those of skill in the art, without departing from the scope of the invention which is defined solely by the claims appended hereto.

I claim:

1. An adaptive filter operating on an input signal to produce an output signal, the filter comprising: a first adaptive signal processing filter for processing the input signal with a first latency and with a first adaptation method to produce a first component of the output signal; a second adaptive signal processing filter processing the input signal with a second latency less than the first latency and with a second adaptation method, the second signal processing filter producing a second component of the output signal; and a summer to combine the first component and second component to produce the output signal, the second component providing compensation for the effect of the first latency on the output signal.

2. The adaptive filter of claim 1 in which the first adaptive signal processing filter is an IIR filter and the first adaptation method is backpropagation.

3. The adaptive filter of claim 1 in which the second adaptive signal processing filter is an FIR filter and the second adaptation method is least mean-square.

4. The adaptive filter of claim 1 in which the first adaptive signal processing filter is an IIR filter and the first adaptation method is backpropagation and in which the second adaptive signal processing filter is an FIR filter and the second adaptation method is least mean-square.

* * * * *